United States Patent
Chen et al.

(10) Patent No.: US 10,877,378 B2
(45) Date of Patent: Dec. 29, 2020

(54) VESSEL FOR EXTREME ULTRAVIOLET RADIATION SOURCE

(71) Applicant: TAIWAN SEMICONDUCTOR MANUFACTURING CO., LTD., Hsinchu (TW)

(72) Inventors: Ssu-Yu Chen, New Taipei (TW); Che-Chang Hsu, Taichung (TW); Chi Yang, Taichung (TW); Shang-Chieh Chien, New Taipei (TW); Li-Jui Chen, Hsinchu (TW); Po-Chung Cheng, Chiayi County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/582,012

(22) Filed: Sep. 25, 2019

(65) Prior Publication Data

US 2020/0103758 A1 Apr. 2, 2020

Related U.S. Application Data

(60) Provisional application No. 62/738,977, filed on Sep. 28, 2018.

(51) Int. Cl.
| | | |
|---|---|---|
| G03F 7/20 | (2006.01) | |
| H05G 2/00 | (2006.01) | |
| G03F 1/22 | (2012.01) | |
| G03F 7/00 | (2006.01) | |

(52) U.S. Cl.
CPC ............ *G03F 7/70033* (2013.01); *G03F 1/22* (2013.01); *G03F 7/0027* (2013.01); *G03F 7/2002* (2013.01); *H05G 2/006* (2013.01)

(58) Field of Classification Search
CPC ...... G03F 7/70033; G03F 1/22; G03F 7/0027; G03F 7/2002; H05G 2/006
See application file for complete search history.

(56) References Cited

U.S. PATENT DOCUMENTS

| | | |
|---|---|---|
| 8,796,666 B1 | 8/2014 | Huang et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |

(Continued)

FOREIGN PATENT DOCUMENTS

| | | |
|---|---|---|
| CN | 101430508 A | 5/2009 |
| CN | 102298270 A | 12/2011 |

(Continued)

*Primary Examiner* — Nicole M Ippolito
*Assistant Examiner* — Hanway Chang
(74) *Attorney, Agent, or Firm* — McDermott Will & Emery LLP

(57) ABSTRACT

A source for generating extreme ultraviolet (EUV) radiation includes a chamber enclosing a low pressure environment. A gas inlet is configured to provide a cleaning gas in the chamber. A plurality of exhaust ports, each having a corresponding gate valve including a scanner gate valve corresponding to an exhaust port separating the chamber from an EUV scanner are provided to the chamber. A pressure sensor is disposed inside the chamber and adjacent to the scanner gate valve. A controller is configured to control the gate valves other than the scanner gate valve based on an output of the pressure sensor.

20 Claims, 9 Drawing Sheets

(56) References Cited

U.S. PATENT DOCUMENTS

| | | |
|---|---|---|
| 9,618,837 B2 | 4/2017 | Lu et al. |
| 9,869,928 B2 | 1/2018 | Huang et al. |
| 9,869,934 B2 | 1/2018 | Huang et al. |
| 9,869,939 B2 | 1/2018 | Yu et al. |
| 2016/0004174 A1 | 1/2016 | Walter et al. |
| 2017/0248842 A1 | 8/2017 | Oster et al. |
| 2018/0267411 A1 | 9/2018 | Srivastava et al. |

FOREIGN PATENT DOCUMENTS

| | | | |
|---|---|---|---|
| JP | 2015-109366 A | 6/2015 | |
| TW | 201244305 A | 11/2012 | |
| TW | 201539111 A | 10/2015 | |
| TW | I631425 B | 8/2018 | |

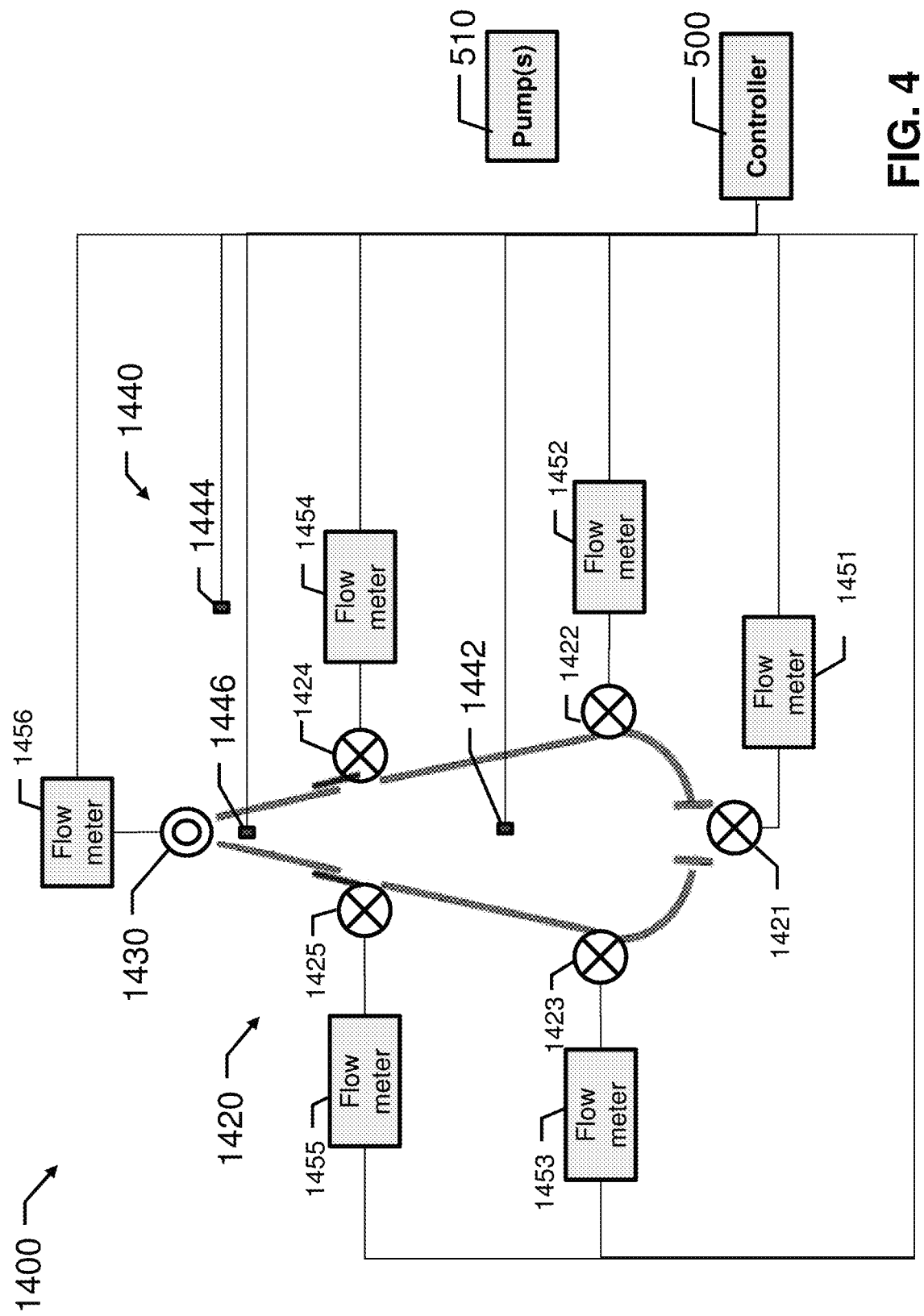

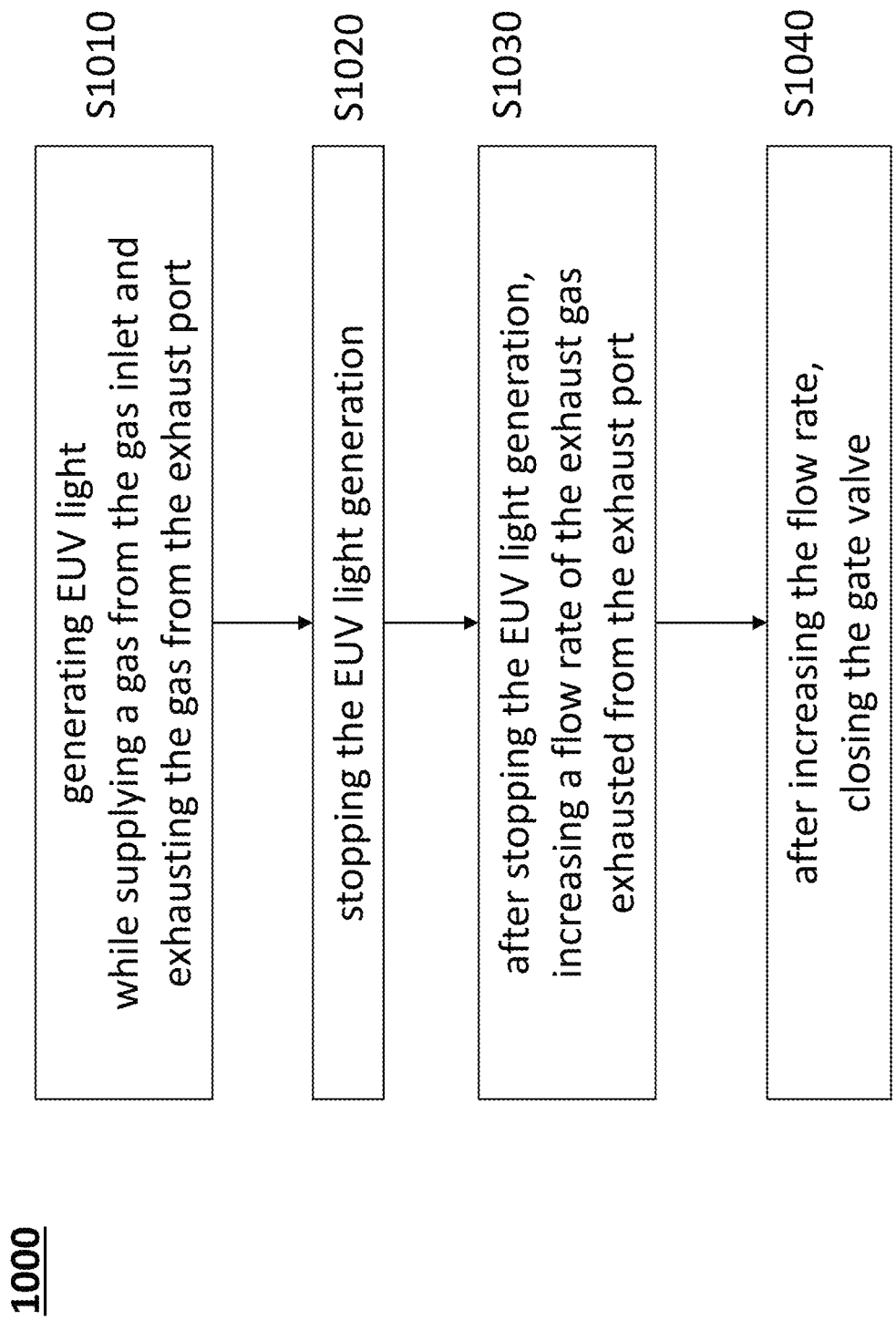

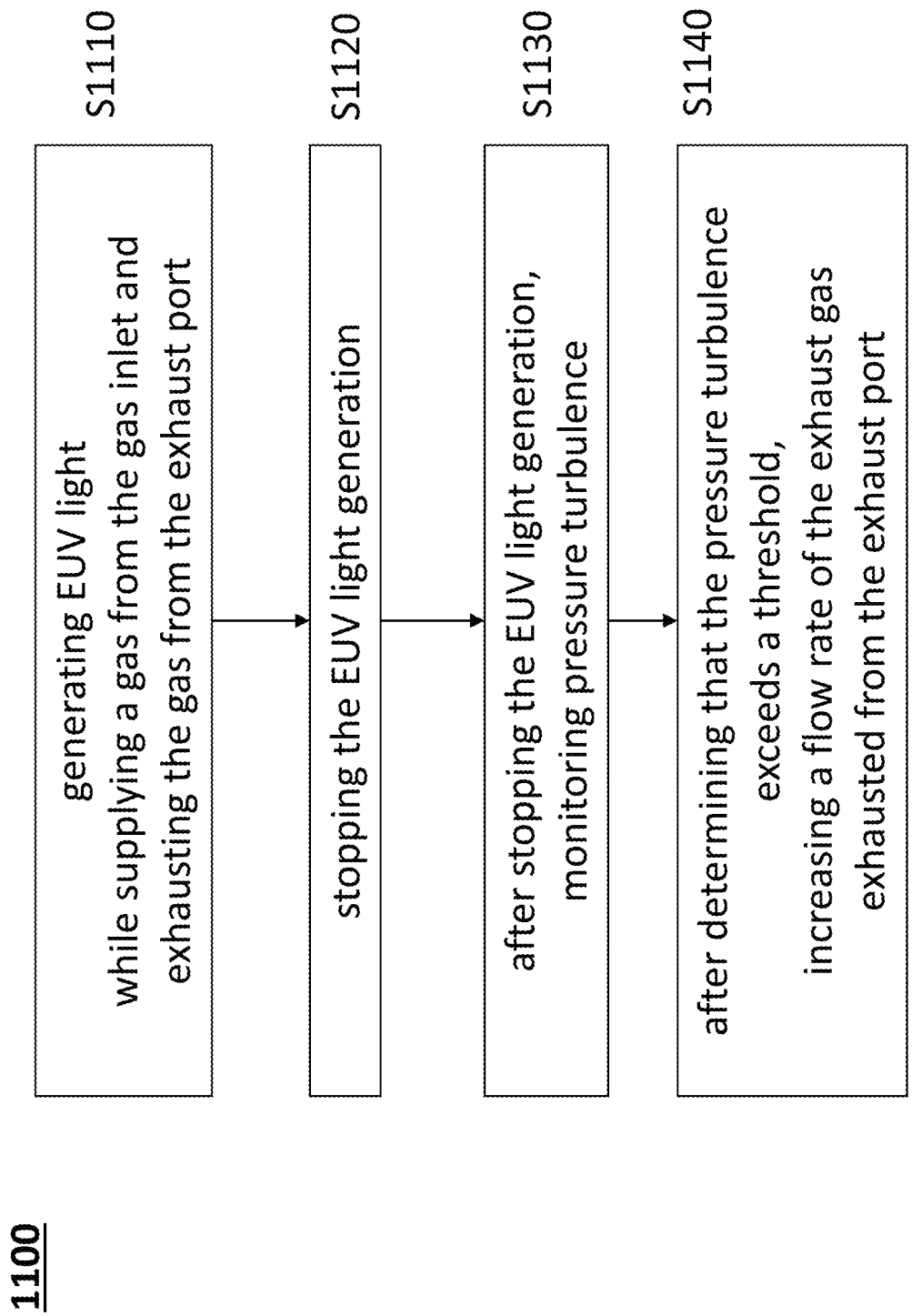

VESSEL FOR EXTREME ULTRAVIOLET RADIATION SOURCE

CROSS-REFERENCE TO RELATED APPLICATION

The present application claims priority to and incorporates by reference U.S. Provisional Application 62/738,977 filed on Sep. 28, 2018 in its entirety.

BACKGROUND

Extreme ultraviolet (EUV) lithography is being used to fabricate semiconductor devices having feature size of less than 22 nm to meet the ever-present demand of increased device density in integrated circuits.

One method of generating EUV radiation for EUV lithography is by using laser produced plasma (LPP), where droplets of molten metal such as tin are heated using a laser to generate plasma which emits the EUV radiation. Because EUV radiation is ionizing radiation, the EUV radiation source is typically kept under vacuum. In other words, the droplets of molten metal are introduced in a vacuum chamber where they are heated to produce the EUV radiation. The EUV radiation produced by the plasma is collected using a collector mirror and focused on other optics from where it is directed to a lithography tool.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 4 schematically illustrates a layout of the debris exhaust control assembly according to various embodiments.

FIGS. 7A and 7B illustrate flow charts of methods of a debris exhaust control assembly to regulate the flow of cleaning gas within the chamber in accordance with embodiments of the present disclosure.

DETAILED DESCRIPTION

Figure 1:
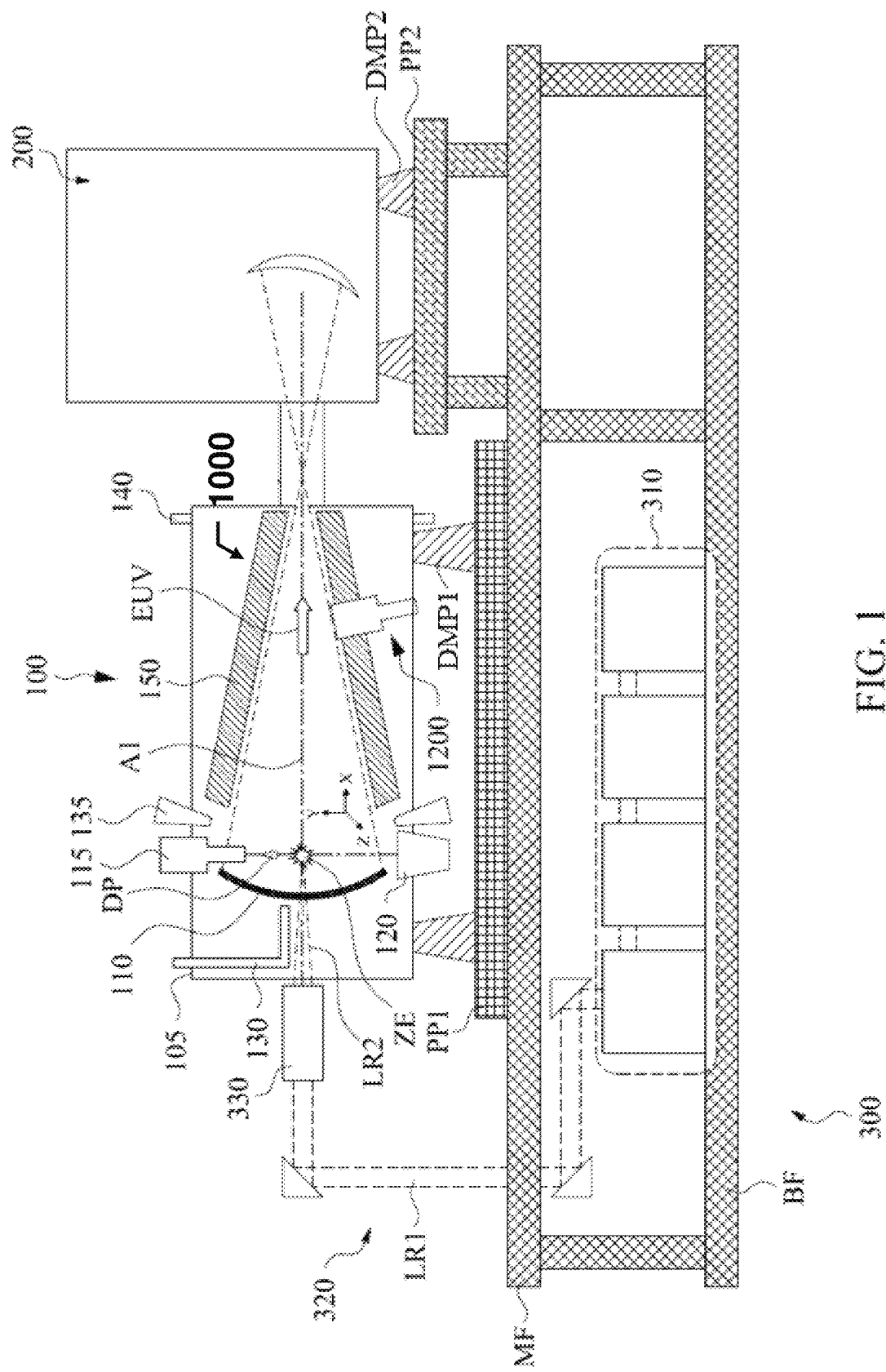
FIG. 1 is a schematic view of an EUV lithography system with a laser produced plasma (LPP) EUV radiation source, constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of."

The present disclosure is generally related to extreme ultraviolet (EUV) lithography system and methods. More particularly, it is related to apparatus and methods for mitigating contamination on an EUV collector mirror in a laser produced plasma (LPP) EUV radiation source. The EUV collector mirror, also referred to as an LPP EUV collector mirror or an EUV collector mirror, is an important component of the LPP EUV radiation source. It collects and reflects EUV radiation and contributes to overall EUV conversion efficiency. However, it is subjected to damage and degradation due to the impact of particles, ions, radiation, and debris deposition. In particular, tin (Sn) debris is one of the contamination sources of the EUV collector mirror. EUV collector mirror life time, the time duration where the reflectivity decays to half of the initial reflectivity, is one of the most important factors for an EUV scanner. The major reason of reflectivity decay of the EUV collector mirror is residual metal contamination (tin debris) on the EUV collector mirror surface caused, inevitably, by the EUV light generation procedure.

One of the objectives of the present disclosure is directed to reducing debris deposition onto the LPP EUV collector mirror thereby increasing its usable lifetime. The technology of this disclosure keeps the EUV collector mirror in a desirable status for a longer period of time by reducing the frequency of swapping the EUV collector mirror. In other words, an EUV scanner will maintain the highest exposure power and throughput, and require less frequent maintenance, thereby reducing the frequency of the week-long down time required to swap EUV collector mirror.

FIG. 1 is a schematic and diagrammatic view of an EUV lithography system. The EUV lithography system includes an EUV radiation source apparatus 100 to generate EUV light, an exposure tool 200, such as a scanner, and an excitation laser source apparatus 300. As shown in FIG. 1, in some embodiments, the EUV radiation source apparatus 100 and the exposure tool 200 are installed on a main floor MF of a clean room, while the excitation source apparatus 300 is installed in a base floor BF located under the main floor MF. Each of the EUV radiation source apparatus 100 and the exposure tool 200 are placed over pedestal plates PP1 and PP2 via dampers DMP1 and DMP2, respectively. The EUV radiation source apparatus 100 and the exposure tool 200 are coupled to each other by a coupling mechanism, which may include a focusing unit.

The lithography system is an extreme ultraviolet (EUV) lithography system designed to expose a resist layer by EUV light (or EUV radiation). The resist layer is a material sensitive to the EUV light. The EUV lithography system employs the EUV radiation source apparatus 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure tool 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss.

In the present disclosure, the terms mask, photomask, and reticle are used interchangeably. In the present embodiment, the mask is a reflective mask. One exemplary structure of the mask includes a substrate with a suitable material, such as a low thermal expansion material or fused quartz. In various examples, the material includes $TiO_2$ doped $SiO_2$, or other suitable materials with low thermal expansion. The mask includes multiple reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The exposure tool 200 includes a projection optics module for imaging the pattern of the mask on to a semiconductor substrate with a resist coated thereon secured on a substrate stage of the exposure tool 200. The projection optics module generally includes reflective optics. The EUV radiation (EUV light) directed from the mask, carrying the image of the pattern defined on the mask, is collected by the projection optics module, thereby forming an image onto the resist.

In the present embodiments, the semiconductor substrate is a semiconductor wafer, such as a silicon wafer or other type of wafer to be patterned. The semiconductor substrate is coated with a resist layer sensitive to the EUV light in the present embodiment. Various components including those described above are integrated together and are operable to perform lithography exposing processes.

The lithography system may further include other modules or be integrated with (or be coupled with) other modules.

As shown in FIG. 1, the EUV radiation source 100 includes a target droplet generator 115 and a LPP EUV collector mirror 110, enclosed by a chamber 105. The target droplet generator 115 generates a plurality of target droplets DP. In some embodiments, the target droplets DP are tin (Sn) droplets. In some embodiments, the tin droplets each have a diameter about 30 microns (μm). In some embodiments, the tin droplets DP are generated at a rate about 50 droplets per second and are introduced into a zone of excitation ZE at a speed about 70 meters per second (m/s). Other material can also be used for the target droplets, for example, a tin containing liquid material such as eutectic alloy containing tin or lithium (Li).

An excitation laser LR2 generated by the excitation laser source apparatus 300 is a pulse laser. In some embodiments, the excitation laser includes a pre-heat laser and a main laser. The pre-heat laser pulse is used to heat (or pre-heat) the target droplet to create a low-density target plume, which is subsequently heated (or reheated) by the main laser pulse, generating increased emission of EUV light.

In various embodiments, the pre-heat laser pulses have a spot size about 100 μm or less, and the main laser pulses have a spot size about 200-300 μm.

The excitation laser (laser pulses) LR2 are generated by the excitation laser source 300. The laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source. The excitation laser (laser light) LR1 generated by the laser generator 310 is guided by the laser guide optics 320 and focused into the excitation laser LR2 by the focusing apparatus 330, and then introduced into the EUV radiation source 100.

The excitation laser (laser light) LR2 is directed through windows (or lenses) into the zone of excitation ZE. The windows adopt a suitable material substantially transparent to the laser beams. The generation of the pulse lasers is synchronized with the generation of the target droplets. As the target droplets move through the excitation zone, the pre-pulses heat the target droplets and transform them into low-density target plumes. A delay between the pre-pulse and the main pulse is controlled to allow the target plume to form and to expand to an optimal size and geometry. When the main pulse heats the target plume, a high-temperature plasma is generated. The plasma emits EUV radiation EUV, which is collected by the EUV collector mirror 110. The EUV collector mirror 110 further reflects and focuses the EUV radiation for the lithography exposing processes. In some embodiments, a droplet catcher 120 is installed opposite the target droplet generator 115. The droplet catcher 120 is used for catching excessive target droplets. For example, some target droplets may be purposely missed by the laser pulses.

The EUV collector mirror 110 is designed with a proper coating material and shape to function as a mirror for EUV collection, reflection, and focusing. In some embodiments, the EUV collector mirror 110 is designed to have an ellipsoidal geometry. In some embodiments, the coating material of the EUV collector mirror 100 is similar to the reflective multilayer of the EUV mask. In some examples, the coating material of the EUV collector mirror 110 includes a ML (such as a plurality of Mo/Si film pairs) and may further include a capping layer (such as Ru) coated on the ML to substantially reflect the EUV light. In some embodiments, the EUV collector mirror 110 may further include a grating structure designed to effectively scatter the laser beam directed onto the EUV collector mirror 110. For example, a silicon nitride layer is coated on the EUV collector mirror 110 and is patterned to have a grating pattern.

In such an EUV radiation source apparatus, the plasma caused by the laser application creates physical debris, such as ions, gases and atoms of the droplet, as well as the desired EUV radiation. It is necessary to prevent the accumulation of material on the EUV collector mirror 110 and also to prevent physical debris exiting the chamber 105 and entering the exposure tool 200.

As shown in FIG. 1, in some embodiments, a buffer gas is supplied from a first buffer gas supply 130 through the aperture in EUV collector mirror 110 by which the pulse laser is delivered to the tin droplets. In some embodiments, the buffer gas is $H_2$, He, Ar, $N_2$ or another inert gas. In certain embodiments, $H_2$ is used as H radicals generated by ionization of the buffer gas can be used for cleaning purposes. The buffer gas can also be provided through one or more second buffer gas supplies 135 toward the EUV collector mirror 110 and/or around the edges of the EUV collector mirror 110. Further, the chamber 105 includes one or more gas outlets 140 so that the buffer gas is exhausted outside the chamber 105.

Hydrogen gas has low absorption to the EUV radiation. Hydrogen gas reaching to the coating surface of the EUV collector mirror 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the outlet 140. However, it is difficult to exhaust all gaseous $SnH_4$ from the chamber and to prevent the $SnH_4$ from entering the exposure tool 200.

To trap the $SnH_4$ or other debris, one or more debris collection mechanisms 150 are employed in the chamber 105.

Figure 2B:
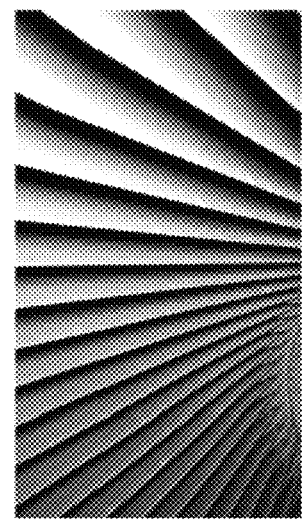
FIG. 2B is a schematic side view of a debris collection mechanism used in the EUV radiation source according to some embodiments of the present disclosure.
Figure 2C:
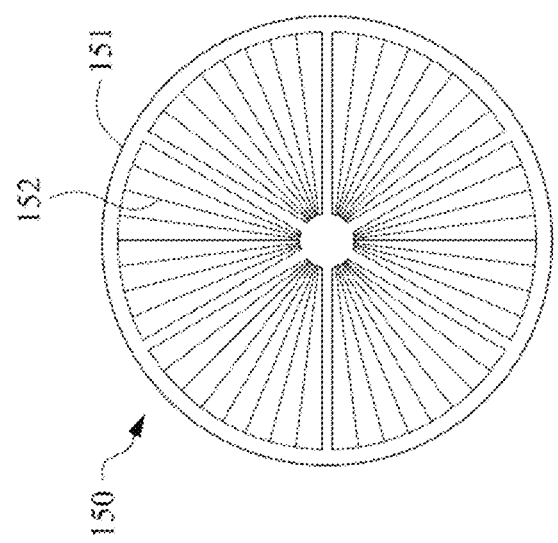
FIG. 2C is a partial picture of a vane used in the EUV radiation source according to some embodiments of the present disclosure.
Figure 2A:
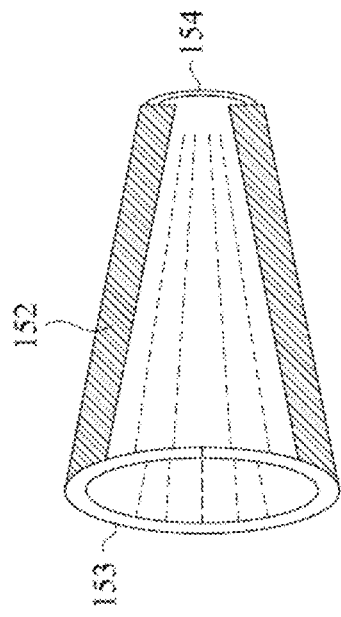
FIG. 2A is a schematic front view of a debris collection mechanism used in the EUV radiation source according to some embodiments of the present disclosure.

As shown in FIG. 1, one or more debris collection mechanisms (DCM) 150 are disposed along the optical axis A1 between the zone of excitation ZE and an output port of the EUV radiation source 100. FIG. 2A is a front view of the debris collection mechanisms 150 and FIG. 2B is a schematic isometric view of the debris collection mechanisms 150. FIG. 2A is a front view of the DCM 150 and FIG. 2B is a schematic side view of DCM 150. FIG. 2C is a partial detailed view of the DCM 150. The debris collection mechanisms 150 include a frustoconical support frame 151, a first end support 153 and a second end support 154 that operably support a plurality of vanes 152 that rotate within the housings. The first end support 153 has a larger diameter than the second end support 154. The debris collection mechanisms 150 serve to prevent the surface of EUV collector mirror 110 and/or other elements/portions of the inside the chamber 105 from being coated by Sn vapor by sweeping out slow Sn atoms and/or $SnH_4$ via rotating vanes 152.

The plurality of vanes 152 project radially inwardly from the frustoconical support frame 151. The vanes 152 are thin and elongate plates. In some embodiments, each of the vanes has a triangular or trapezoid or trapezium shape in plan view. The vanes 152 are aligned so that their longitudinal axes are parallel to the optical axis A1 so that they present the smallest possible cross-sectional area to the EUV radiation EUV. The vanes 152 project towards the optical axis A1, but do not extend as far as the optical axis. In some embodiments, a central core of the debris collection mechanisms 150 is empty. The debris collection mechanisms 150 are rotated by a drive unit including one or more motors, one or more belts and/or one or more gears, or any rotating mechanism. The vanes 152 are heated at 100° C. to 400° C. by a heater in some embodiments.

Figure 3:
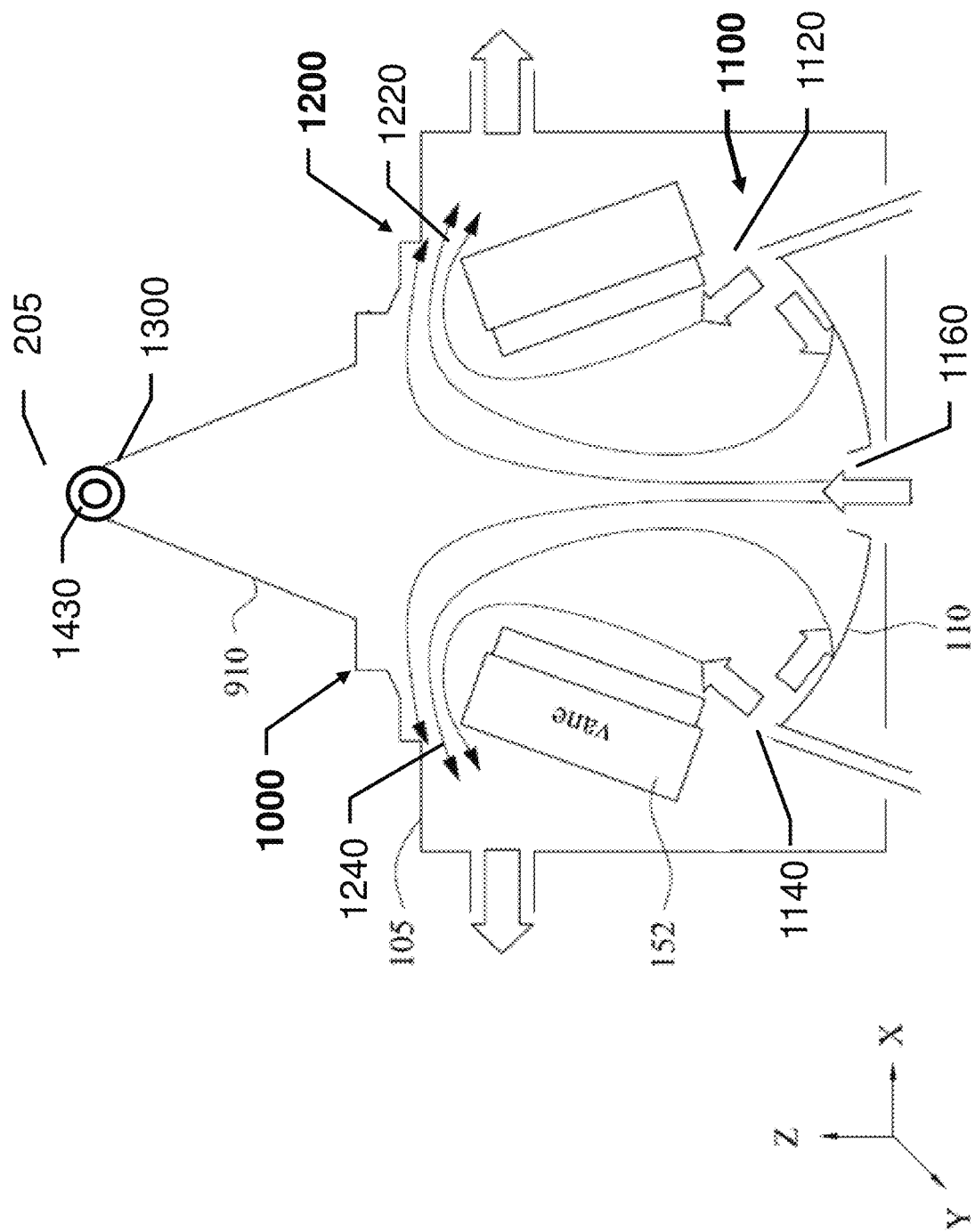
FIG. 3 schematically illustrates an exhaust flow for an EUV source according to an embodiment.

FIG. 3 schematically illustrates an EUV vessel 1000 for an EUV source according to an embodiment. The EUV vessel 1000 is located within the chamber 105 and includes: a collector mirror 110, a droplet generator 115 (see FIG. 1), a tin catcher 120 (see FIG. 1), vanes 152, and a lower cone 910.

The EUV vessel 1000 includes gas inlet ports 1100, gas exhaust ports 1200, and a scanner gate port 1300 for receiving and transmitting cleaning gas. The scanner gate port 1300 is an interface port that is connected between the EUV vessel 1000 and a scanner 205. The scanner gate port 1300 separates the EUV vessel 1000, ultimately the chamber 105, from the scanner 205. In some embodiments, a scanner gate valve (SGV) 1430 is disposed at the interface port and the gas exhaust ports 1200. The EUV vessel 1000 may transmit and receive the cleaning gas such as, for example, hydrogen gas, to and/or from the chamber 105 within the EUV radiation source apparatus 100. Hydrogen gas flowing through the EUV vessel 1000 may adhere to the debris within the EUV vessel 1000, such that the hydrogen gas may remove the debris to outside the EUV vessel 1000.

The gas inlet ports 1100 includes a first inlet port 1120, a second inlet port 1140, and a third inlet port 1160. The first and second inlet ports 1120, 1140 are located adjacent to a perimeter portion of the collector mirror 110. The third inlet port 1160 is located in a center portion and through the collector mirror 110. The gas exhaust ports 1200 includes a first exhaust port 1220 and a second exhaust port 1240. The first and second exhaust ports 1220, 1240 are located adjacent to a larger perimeter portion of the lower cone 910. The first exhaust port 1220 and the second exhaust port 1240 are located symmetrically along the z-axis in some embodiments. The scanner gate port 1300 acts as inlet and/or exhaust ports and separates the EUV vessel 1000 of the chamber 105 and the scanner 205. While the EUV vessel 1000 shown in FIG. 3 includes the aforementioned inlet/exhaust ports, alternative embodiments of the EUV vessel 1000 may include a different number and/or arrangement of inlet and/or exhaust ports.

FIG. 4 illustrates a schematic view of a debris exhaust control assembly 1400 according to an embodiment of the present disclosure. The debris exhaust control assembly 1400 includes control valves 1421, 1422, 1423, 1424, and 1425 (collectively 1420), the scanner gate valve (SGV) 1430, and pressure sensors 1442, 1444, and 1446 (collectively 1440). Each of the gas inlet ports and the gas exhaust ports are connected to the control valves 1420, respectively, to control the flow rate of the gas flowing (in or out of the EUV vessel 1000 and the chamber 105) through the ports.

In some embodiments, a controller 500 is operatively connected to the pressure sensors 1440, the control valves 1420, and pump(s) 510. The controller 500 controls operations of the valves 1421, 1422, 1423, 1424, 1425, individually and 1430 based on measured flow rates of each of the flow meters 1451, 1452, 1453, 1454, 1455, 1456, respectively. In some embodiments, the exhaust valves 1424, 1425 along the sides of the EUV vessel 1000 includes a feedback control based on an inner pressure value measured at the pressure sensor 1442. Such a feedback control maintains the inner pressure value constant to make the droplets and the plasma stable. In some embodiments, the exhaust valves 1424, 1425 include another feedback control based on an inner pressure value measured at the pressure sensor 1442 and an outer pressure value measured at the pressure sensor 1444. In some embodiments, the exhaust valves 1424, 1425 along the sides of the EUV vessel 1000 are replaced with butterfly valves in order to control the flow rates based on a local pressure value measured at the scanner gate valve (SGV) 1430 reported by the pressure sensor 1446. It is noted that while the embodiment described above describes the butterfly valve, any variable opening valve that can be controlled by the debris exhaust control assembly 1400 can be used instead of the butterfly valve. For example, in some embodiments, a shutter valve, a twin-mesh valve, or a sliding gate valve are used. In some embodiments, the controller 500 includes a processor and a memory storing a control program and when the control program is executed by the processor, the control program causes the processor to perform intended operations. In other embodiments, the controller 500 includes a microcomputer.

One of the methods includes improving flow dynamics and/or characteristics of the hydrogen (or similar cleaning gas) in the chamber by suppressing turbulence such that the debris can be exhausted smoothly from the EUV vessel 1000 and the chamber 105. Such a flow prevents the plasma and/or debris of the eroded material from reaching to the collector mirror 110 and ultimately removes them from the chamber 105. The debris exhaust control assembly 1400 of this disclosure utilizes gas inlet ports and the gas exhaust ports that are connected with the control valves 1420 to control the flow rate of the exhaust gas. The debris exhaust control assembly 1400 is configured to remove the debris from the EUV vessel 1000 and the chamber 105 with improved techniques minimizing the turbulence within the EUV vessel 1000.

Figures 5A, 5B:
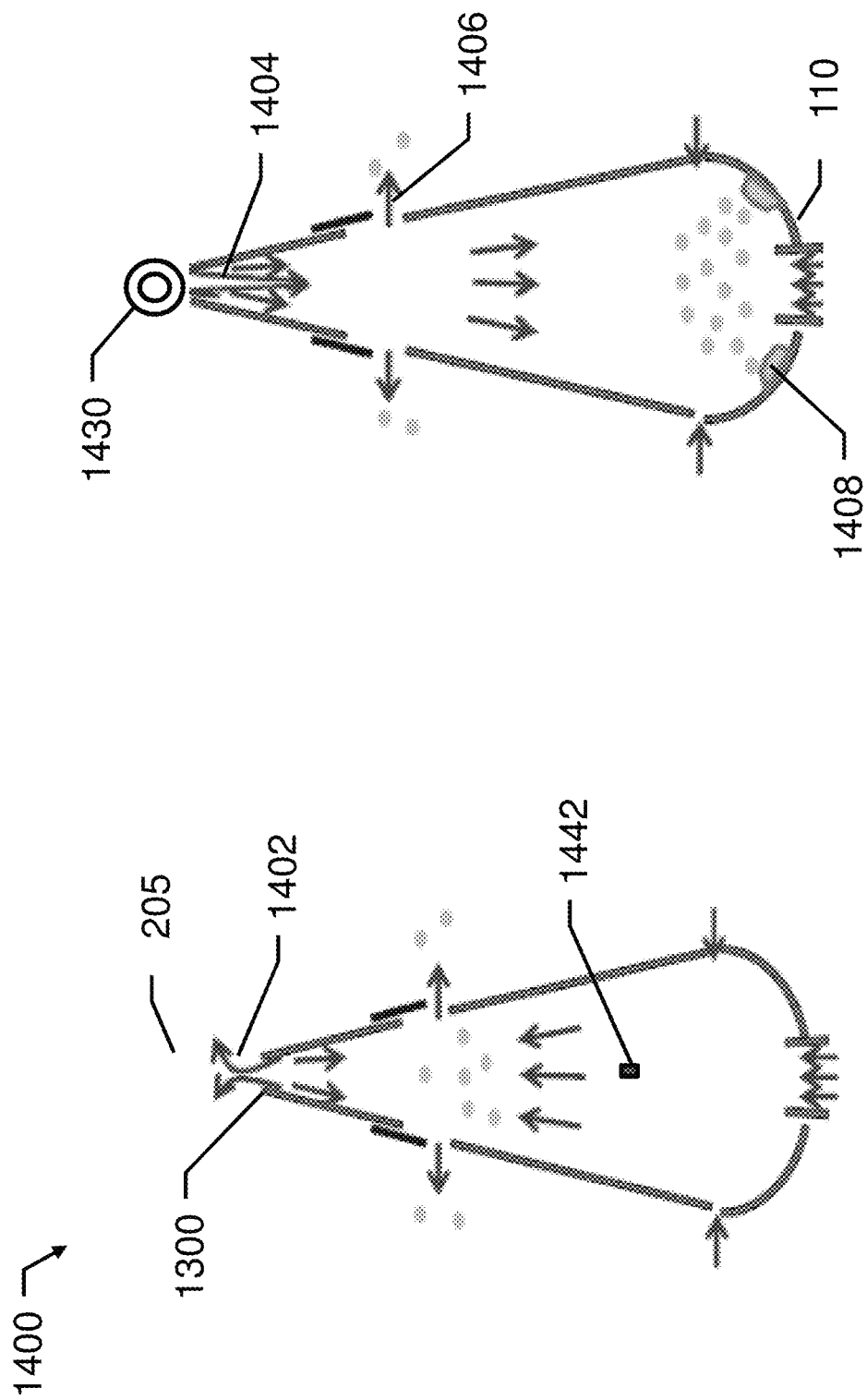
FIGS. 5A and 5B schematically illustrate an exhaust flow in an EUV vessel for an EUV source according to some embodiments.

FIGS. 5A and 5B schematically illustrate an exhaust flow in the EUV vessel for an EUV source. In some embodiments, the EUV vessel 1000 regulates the flow of hydrogen based on the inner pressure value measured at the pressure sensor 1442 to maintain the inner pressure value constant during a normal EUV generating operation. In some embodiments, as shown in FIG. 5A, the scanner gate port 1300 acts as an inlet/exhaust port to the scanner 205. In such embodiment, the cleaning gas may be mixed with the debris and flow into the scanner 205. In order to prevent the flow of the gas mixed with the debris toward the scanner 205, in some embodiments, as shown in FIG. 5B, when EUV generation is stopped, the scanner gate valve (SGV) 1430 is closed to separate the EUV vessel 1000 from the scanner 205 for a flushing operation. Therefore, the scanner gate valve 1430 prevents the flow of the gas mixed with the debris from the radiation chamber to the scanner 205, e.g., when flushing the chamber for cleaning. However, the outflow of hydrogen 1402, shown in FIG. 5A, is disturbed and results in a turbulent flow of hydrogen 1404 within the EUV vessel 1000, as shown in FIG. 5B, due to a sudden change of the outflow of hydrogen 1402. Such a turbulent flow 1404 has the potential for not only disturbing the outflow of tin debris 1406 but further resulting in a contamination 1408 deposited on the collector mirror 110 over a period of time.

Figure 6:
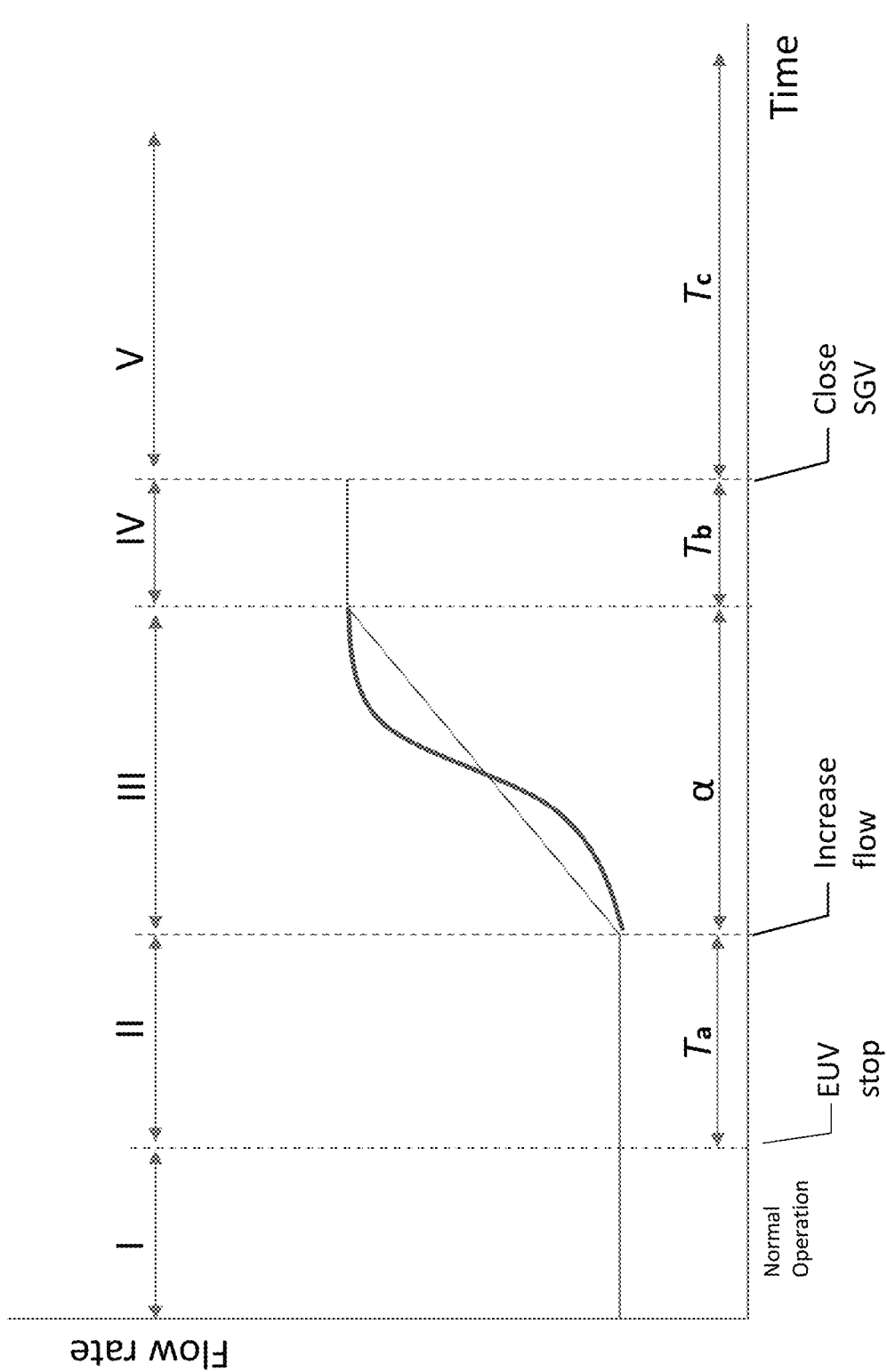
FIG. 6 illustrates a graph showing a variation in an exhaust flow rate with respect to a time.

FIG. 6 illustrates a graph showing a variation in an exhaust flow rate using the debris exhaust control assembly 1400. The horizontal axis represents an elapsed time. During phase I, a normal operation (EUV generation) is performed with the cleaning gas supplied from the gas inlet and exhausting the gas exhausted through the exhaust ports as shown in FIG. 5A. When the normal operation is stopped, during phase II, the debris exhaust control assembly 1400 continues transmitting and receiving the cleaning gas to and/or from the chamber without increasing the exhaust flow rate. During phase II, a first time Ta is in a rage from about 6 minutes to 10 minutes. In some embodiments, the first time Ta is one of the following times: 6 minutes, 7 minutes, 8 minutes, 9 minutes, and 10 minutes. When the first time Ta is completed, during phase III, the debris exhaust control assembly 1400 controls the gas exhaust ports and/or exhaust pump(s) to increase the exhaust flow rates through the first and second exhaust ports 1220, 1240. In some embodiments, a time a for the phase III of the debris exhaust control assembly 1400 may vary depending on the situation. For example, the time a is in a range from about 3 minutes to 7 minutes. In some embodiments, the time a for the phase III is about 5 minutes. In some embodiments, the debris exhaust control assembly 1400 increases the exhaust flow rates linearly. In some embodiments, the debris exhaust control assembly 1400 increases the exhaust flow rates based on an inner pressure value measured at the pressure sensor 1442. In other embodiments, the debris exhaust control assembly 1400 increases the exhaust flow rates based on an inner pressure value measured at the pressure sensor 1442 and an outer pressure value measured at the pressure sensor 1444. In some embodiments, the debris exhaust control assembly 1400 increases the exhaust flow rate based on a local pressure value measured at the scanner gate valve (SGV) 1430 reported by the pressure sensor 1446. The debris exhaust control assembly 1400 is configured to control the exhaust flow rate within an acceptable range prior to a second time Tb of the phase IV. In some embodiments, the second time Tb of phase IV is in a range from about 3 minutes to 5 minutes. In some embodiments, the second time Tb of phase IV is one of the following times: 3 minutes, 4 minutes, and 5 minutes. When the second time Tb of the phase IV is completed, the scanner gate valve 1430 is closed and the debris exhaust control assembly 1400 performs a flushing operation for a third time Tc of the phase V. In some embodiments, the third time Tc of the phase V for the flushing operation is in a range from about 150 minutes to 210 minutes. In some embodiments, the third time Tc of the phase V is about 180 minutes.

During the flushing operation, an extreme clean dry air (XCDA) is supplied and exhausted several times for the cleaning purpose. In some embodiments, XDCA includes $N_2$ gas. In some embodiments, the XCDA is used in a range from about 3 times to about 5 times. In some embodiments, the XCDA is used 4 times. The XCDA is introduced between a first pressure and a second pressure. In some embodiments, the first pressure (filling pressure) for the flushing operation is in a range from about 700 Pa to 900 Pa. In some embodiments, the first pressure is about 800 Pa. In some embodiments, the second pressure (exhausted pressure) for the flushing operation is in a range from about 300 Pa to 500 Pa. In some embodiments, the second pressure is about 400 Pa. In some embodiments, the second pressure for the flushing operation is in a range from about 40% to about 60% of the first pressure. In some embodiments, the second pressure is in a range from about 30% to about 70% of the first pressure.

FIG. 7A illustrates a flow chart of a method 1000 of controlling the debris exhaust control assembly 1400 in accordance with an embodiment of the present disclosure. The method includes, at S1010, generating EUV light while supplying a gas from the gas inlet and exhausting the gas from the exhaust port. Then, the method includes, at S1020, stopping the EUV light generation.

After stopping the EUV light generation, the method includes, at S1030, increasing a flow rate of the exhaust gas exhausted from the exhaust ports. The flow rates measured by the flow meters 1454, 1455 indicate the performance of the debris exhaust control assembly 1400. In some embodiments where changes in the flow rates are detected by the flow meters 1454, 1455, the controller performs a determination based on a value of flow rates and/or a changing rate of the flow rates measured by the flow meters 1451, 1452, 1453, 1454, 1455, 1456. In some embodiments, the flow meters 1451, 1452, 1453, 1454, 1455, 1456 include a logic circuit programmed to generate a predetermined signal when the detected variation in flow rate measurement is not within an acceptable range. For example, a signal is generated when the detected variation in flow rate measurement is less than a certain threshold value. The threshold value of variation in flow rate measurement is, for example, an expected minimum variation in flow rate measurement of the debris exhaust control assembly 1400. In some embodiments, the expected minimum variation in flow rate measurement is determined based an average variation in flow rate measurement for a largest change. In some embodiments, the expected minimum variation in flow rate measurement is, for example, one standard deviation or two standard deviations less than the average variation in flow rate measurement determined for the largest change. If the flow rate measurement of the flow meters 1454, 1455 are not within the acceptable range, configurable parameters of the exhaust valves 1424 and/or pumps connected are automatically adjusted to increase or decrease the variation in flow rate measurement by the flow meters 1454, 1455 so as to ultimately bring the exhaust flow rate within the acceptable range.

At S1040, after increasing the flow rate, the method includes closing the gate valve.

FIG. 7B illustrates a flow chart of a method 1100 of controlling the debris exhaust control assembly 1400 in accordance with another embodiment of the present disclosure. The method includes, at S1110, generating EUV light while supplying a gas from the gas inlet and exhausting the gas from the exhaust port. Then, the method includes, at S1120, stopping the EUV light generation.

After stopping the EUV light generation, the method includes, at S1130, monitoring a pressure turbulence indicated by the measurements from the pressure sensors 1442, 1444, and 1446 (collectively 1440). In particular, the pressure measurement by the pressure sensor 1446 located adjacent to the scanner gate valve (SGV) 1430 of the EUV vessel 1000 is used to monitor the pressure turbulence caused by the cleaning gas within the vessel. In some embodiments, the pressure turbulence is determined by the controller 500 of debris exhaust control assembly 1400 based on whether the pressure measurement by the pressure sensor 1446 is increasing and/or decreasing. The pressure measured by the pressure sensor 1446 indicates the pressure turbulence adjacent to the scanner gate valve (SGV) 1430. In some embodiments, changes in the pressure are detected by the pressure sensors 1442, 1444, and 1446 (collectively 1440), the controller 500 of debris exhaust control assembly 1400 performs a determination based on a value of pressure and/or a changing rate of the pressure measured by the pressure sensors 1442, 1444, and 1446. In some embodiments, the pressure sensors 1440 include a logic circuit programmed to generate a predetermined signal when the detected variation in pressure measurement is not within an acceptable range. For example, a signal is generated when the detected variation in a pressure measurement is above a certain threshold value. The threshold value of variation in pressure measurement is, for example, an expected minimum variation in pressure measurement. In some embodiments, the expected minimum variation in pressure measurement is determined based an average variation in pressure measurement for a largest change. In some embodiments, the expected minimum variation in pressure measurement is, for example, one standard deviation or two standard deviations less than the average variation in flow rate measurement determined for the largest change.

After determining, by the controller 500 of debris exhaust control assembly 1400, that the pressure turbulence exceeds a threshold, at S1140, configurable parameters of the exhaust valves 1424, 1425 are automatically adjusted to increase a flow rate of the exhaust gas exhausted from the exhaust port so as to ultimately bring the exhaust flow rate to its optimum flow rate within the acceptable range.

Figure 8:
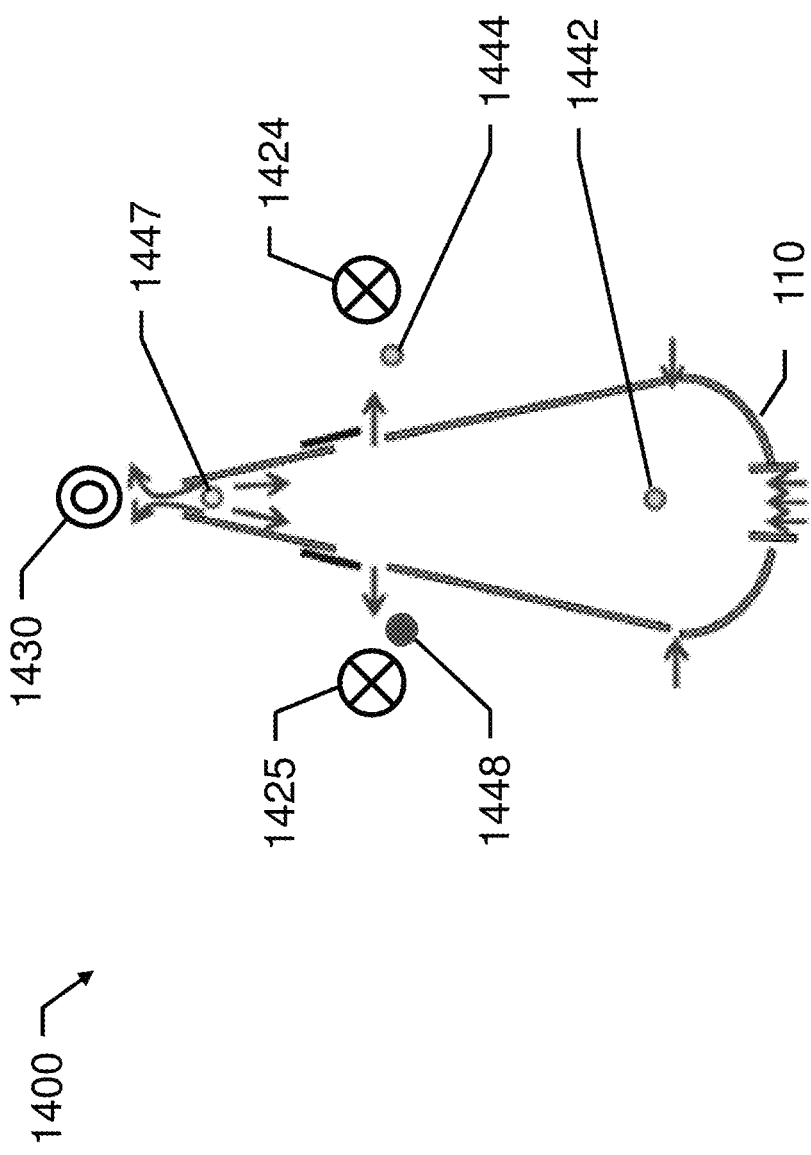
FIG. 8 schematically illustrates an exhaust flow in an EUV vessel for an EUV source according to another embodiment.

FIG. 8 illustrates a schematic view of an exemplary debris exhaust control assembly 1400 according to an embodiment of the present disclosure. In some embodiments, the debris exhaust control assembly 1400 includes the pressure sensors 1442, 1444, and a first pressure sensor 1447 adjacent to the scanner gate valve (SGV) 1430 and a second pressure sensor 1448 located adjacent to the exhaust valve 1425. In some embodiments, the debris exhaust control assembly 1400 identifies an airflow between the scanner gate valve (SGV) 1430 and the collector mirror 110 when the pressure measured by the pressure sensor 1447 is higher and/or lower than the pressure measured by the pressure sensor 1442. In some embodiments, the debris exhaust control assembly 1400 identifies a minimum airflow between the scanner gate valve (SGV) 1430 and the collector mirror 110 when the pressure measured by the pressure sensor 1447 and the pressure sensor 1442 are close to each other. In some embodiments, the debris exhaust control assembly 1400 identifies an airflow turbulence between the scanner gate valve (SGV) 1430 and the collector mirror 110 when both pressure values measured by the pressure sensor 1447 and the pressure sensor 1442 change rapidly. In some embodiments, the debris exhaust control assembly 1400 identifies an exhaust flow balance between the exhaust valves 1424, 1425 using a pressure measurement by the pressure sensor 1444 located adjacent to the exhaust valve 1424 and the second pressure sensor 1448 located adjacent to the exhaust valve 1425.

Embodiments disclosed in the present disclosure improve a productivity of the EUV light generation by extending the life of collector mirror and maintaining the EUV light generation apparatus with good reflectivity of the collector mirror. Embodiments disclosed herein also improve an availability of the EUV light generation apparatus by reducing the down time needed for the preventive maintenance when swapping the collector mirror. Embodiments disclosed herein improve a reliability by mitigating the risk of the contamination in the collector mirror.

In accordance with one aspect of the present disclosure, a method of operating an EUV light generation apparatus includes generating EUV light while supplying a gas from a gas inlet and exhausting the gas from an exhaust port. The EUV light generation apparatus includes a vessel having the gas inlet, an interface port, and the exhaust port. The interface port is connected to a scanner and a gate valve is disposed at the interface port. Then, the EUV light generation is stopped. After stopping the EUV light generation, the flow rate of the exhaust gas exhausted from the exhaust port is increased. After increasing the flow rate, the gate valve is closed. In some embodiments, after stopping the EUV light generation, the method further monitors a pressure turbulence to suppress airflow from the gate valve toward the collector mirror. In some embodiments, the method further controls the flow rate of the exhaust gas based on an inner pressure value measured at a pressure sensor located inside the vessel. In some embodiments, the method further controls the flow rate of the exhaust gas based on an inner pressure measured by a pressure sensor located inside the vessel and an outer pressure measured by a pressure sensor located outside the vessel. In some embodiments, the method further controls the flow rate of the exhaust gas based on a local pressure value measured by a pressure sensor adjacent to a scanner gate valve. In some embodiments, after stopping the EUV light generation, the method waits for about less than 10 minutes before increasing the flow rate of the exhaust gas exhausted from the exhaust port. In some embodiments, after increasing a flow rate of the exhaust gas, the method waits for about less than 5 minutes before closing the gate valve.

In accordance with another aspect of the present disclosure, a method of operating an EUV light generation apparatus includes generating EUV light while supplying a gas from a gas inlet and exhausting the gas from an exhaust port. The EUV light generation apparatus includes a vessel having the gas inlet, an interface port, and the exhaust port. The interface port is connected to a scanner and a gate valve is disposed at the interface port. Then, the EUV light generation is stopped. After stopping the EUV light generation, the pressure turbulence adjacent to a scanner gate valve is monitored. After determining that the pressure turbulence exceeds a threshold, the flow rate of the exhaust gas exhausted from the exhaust port is increased. In some embodiments, the method further closes the gate after increasing the flow rate. In some embodiments, the method further closes the gate before increasing the flow rate and after stopping the EUV generation. In some embodiments, after stopping the EUV light generation, the method waits for about less than 10 minutes monitoring the pressure turbulence adjacent to the scanner gate valve. In some embodiments, after increasing a flow rate of the exhaust gas, the method waits for about less than 5 minutes before closing the gate valve. In some embodiments, after closing the gate valve, the method performs a flushing operation to clean the vessel.

In accordance with another aspect of the present disclosure, an apparatus for generating extreme ultraviolet (EUV) radiation includes a chamber, an EUV vessel, and a controller. The EUV vessel is disposed in the chamber. The EUV vessel includes a gas inlet, an interface port, a gate valve disposed at the interface port and an exhaust port. The gas inlet is configured to provide a cleaning gas into the EUV vessel. The interface port is connected to a scanner. The controller is configured to control the gate valve to suppress airflow from the gate valve toward the collector mirror. In some embodiments, the pressure sensor is located adjacent the gate valve to measure a local pressure within the chamber in the vicinity of the scanner gate valve. In some embodiments, the exhaust port includes a butterfly valve. In some embodiments, the controller is configured to control the gate valve based on a measurement of a pressure sensor inside the EUV vessel. In some embodiments, the controller is configured to increase a flow rate of an exhaust gas less than about 10 minutes after an EUV light generation is stopped. In some embodiments, the apparatus further includes a second pressure sensor to monitor an exhaust flow balance between the exhaust valves. In some embodiments, the controller is configured to control the exhaust valves based on a local pressure value measured at the scanner gate valve.

It will be understood that not all advantages have been necessarily discussed herein, no particular advantage is required for all embodiments or examples, and other embodiments or examples may offer different advantages.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of operating an EUV light generation apparatus, wherein the EUV light generation apparatus includes a vessel having a gas inlet, an interface port to be connected to a scanner, a gate valve disposed at the interface port and an exhaust port, the method comprising:
generating EUV light while supplying a gas from the gas inlet and exhausting the gas from the exhaust port;
stopping the EUV light generation;
after stopping the EUV light generation, increasing a flow rate of the exhaust gas exhausted from the exhaust port; and
after increasing the flow rate, closing the gate valve.

2. The method according to claim 1, further comprising, after stopping the EUV light generation, monitoring a pressure turbulence to suppress airflow from the gate valve toward the collector mirror.

3. The method according to claim 1, further comprising controlling the flow rate of the exhaust gas based on an inner pressure value measured at a pressure sensor located inside the vessel.

4. The method according to claim 1, further comprising controlling the flow rate of the exhaust gas based on an inner pressure measured by a pressure sensor located inside the vessel and an outer pressure measured by a pressure sensor located outside the vessel.

5. The method according to claim 1, further comprising controlling the flow rate of the exhaust gas based on a local pressure value measured by a pressure sensor adjacent to a scanner gate valve.

6. The method according to claim 1, further comprising, after stopping the EUV light generation, waiting for about less than 10 minutes before increasing the flow rate of the exhaust gas exhausted from the exhaust port.

7. The method according to claim 1, further comprising, after increasing the flow rate of the exhaust gas, waiting for about less than 5 minutes before closing the gate valve.

8. A method of operating an EUV light generation apparatus, wherein the EUV light generation apparatus includes a vessel having a gas inlet, an interface port connected to a scanner, a gate valve disposed at the interface port and an exhaust port, the method comprising:
generating EUV light while supplying a gas from the gas inlet and exhausting the gas from the exhaust port;
stopping the EUV light generation;

after stopping the EUV light generation, monitoring a pressure turbulence adjacent to a scanner gate valve; and after determining that the pressure turbulence exceeds a threshold, increasing a flow rate of the exhaust gas exhausted from the exhaust port.

9. The method according to claim 8, further comprising after increasing the flow rate, closing the gate valve.

10. The method according to claim 9, further comprising before increasing the flow rate and after stopping the EUV generation, closing the gate valve.

11. The method according to claim 9, further comprising, after stopping the EUV light generation, waiting for about less than 10 minutes monitoring the pressure turbulence adjacent to the scanner gate valve.

12. The method according to claim 9, further comprising, after increasing a flow rate of the exhaust gas, waiting for about less than 5 minutes before closing the gate valve.

13. The method according to claim 12, further comprising, after closing the gate valve, performing a flushing operation to clean the vessel.

14. An apparatus for generating extreme ultraviolet (EUV) radiation, comprising:
a chamber;
an EUV vessel disposed in the chamber, wherein the EUV vessel comprising:
a gas inlet configured to provide a cleaning gas into the EUV vessel;
an interface port to be connected to a scanner;
a gate valve disposed at the interface port and an exhaust port; and
a controller configured to control the gate valve to suppress airflow from the gate valve toward the collector mirror.

15. The apparatus according to claim 14, wherein the pressure sensor is located adjacent the gate valve to measure a local pressure within the chamber in the vicinity of the scanner gate valve.

16. The apparatus according to claim 14, wherein the exhaust port includes a butterfly valve.

17. The apparatus according to claim 14, wherein the controller is configured to control the gate valve based on a measurement of a pressure sensor inside the EUV vessel.

18. The apparatus according to claim 14, wherein the controller is configured to increase a flow rate of an exhaust gas less than about 10 minutes after an EUV light generation is stopped.

19. The apparatus according to claim 14, further comprising a second pressure sensor to monitor an exhaust flow balance between the exhaust valves.

20. The apparatus according claim 14, wherein the controller is configured to control the exhaust valves based on a local pressure value measured at the scanner gate valve.

* * * * *